United States Patent
Yamauchi

(10) Patent No.: US 7,231,006 B2
(45) Date of Patent: Jun. 12, 2007

(54) RECEIVER AND METHOD FOR GENERATING A CONTROL SIGNAL

(75) Inventor: Shigeki Yamauchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 777 days.

(21) Appl. No.: 10/462,617

(22) Filed: Jun. 17, 2003

(65) Prior Publication Data

US 2003/0232608 A1 Dec. 18, 2003

(30) Foreign Application Priority Data

Jun. 18, 2002 (JP) .............................. 2002-176740

(51) Int. Cl.
*H04L 27/08* (2006.01)
(52) U.S. Cl. ...................................... 375/345
(58) Field of Classification Search ................ 375/324, 375/326, 327, 344, 345; 455/232.1, 234.1, 455/234.2, 355
See application file for complete search history.

(56) References Cited

U.S. PATENT DOCUMENTS

| | | | |
|---|---|---|---|
| 5,548,616 A * | 8/1996 | Mucke et al. ................ | 375/295 |
| 5,638,140 A * | 6/1997 | Krishnamurthy et al. ... | 348/735 |
| 6,459,458 B1 * | 10/2002 | Balaban ....................... | 348/678 |
| 6,545,532 B1 * | 4/2003 | Maalej et al. ................ | 329/304 |
| 6,628,732 B1 * | 9/2003 | Takaki ......................... | 375/345 |
| 6,782,250 B2 * | 8/2004 | Rainish et al. ........... | 455/343.2 |
| 7,065,164 B1 * | 6/2006 | Sakima ........................ | 375/345 |
| 2001/0055328 A1 * | 12/2001 | Dowling ...................... | 375/130 |
| 2003/0053562 A1 * | 3/2003 | Busson et al. ............... | 375/322 |

FOREIGN PATENT DOCUMENTS

| | | |
|---|---|---|
| JP | 10-056343 | 2/1998 |
| JP | 11-112461 | 4/1999 |
| JP | 11-195941 | 7/1999 |
| JP | 11-261433 | 9/1999 |
| JP | 2000-040929 | 2/2000 |
| JP | 2000-252868 | 9/2000 |
| JP | 2000-316029 | 11/2000 |
| JP | 2000-349847 | 12/2000 |
| JP | 2001-326549 | 11/2001 |

* cited by examiner

*Primary Examiner*—Emmanuel Bayard
(74) *Attorney, Agent, or Firm*—Volentine & Whitt, P.L.L.C

(57) ABSTRACT

A receiver includes an amplifier which is responsive to a control signal to amplify an input signal and which outputs a corresponding amplified signal, a demodulator which demodulates the amplified signal to generate first and second components, a converter which generates first samples corresponding to the respective first and second components and which digitalizes the first sample, and an auto gain controller (AGC) which generates second samples corresponding to the digitalized first samples and which generates the control signal corresponding to the second samples.

18 Claims, 10 Drawing Sheets

RECEIVER AND METHOD FOR GENERATING A CONTROL SIGNAL

BACKGROUND OF THE INVENTION

1. Field of the Invention

The present invention relates, in general, to a control circuit, and, more particularly, to a receiver and method for generating a control signal.

This is a counterpart of and claims priority to Japanese patent application Serial Number 176740/2002, filed on Jun. 18, 2002, the subject matter of which is incorporated herein by reference.

2. Description of the Related Art

A conventional receiver converts a frequency of a received signal from a radio frequency to an intermediate frequency, generates a signal of a desired frequency band, demodulates the signal to generate an in-phase component and a quadrature phase component, and digitalizes the in-phase component and the quadrature phase component. Then, the conventional receiver generates a control signal by comparing the digitalized components and threshold values.

However, the conventional receiver exhibits increases an error rate when reception level of an adjacent channel signal is large.

SUMMARY OF THE INVENTION

According to one aspect of the present invention, there is provided a receiver including an amplifier which is responsive to a control signal to amplify an input signal and which outputs a corresponding amplified signal, a demodulator which demodulates the amplified signal to generate first and second components, a converter which generates first samples corresponding to the respective first and second components and which digitalizes the first samples, and an auto gain controller (AGC) which generates second samples corresponding to the digitalized first samples and which generates the control signal corresponding to the second samples.

DETAILED DESCRIPTION OF THE PREFERRED EMBODIMENTS

The preferred embodiments of the present invention will be described. However, the invention is not limited to the specific embodiments. Moreover, not all the combinations of the characteristics of the present invention described in the embodiments are essential to the present invention.

Figure 1:
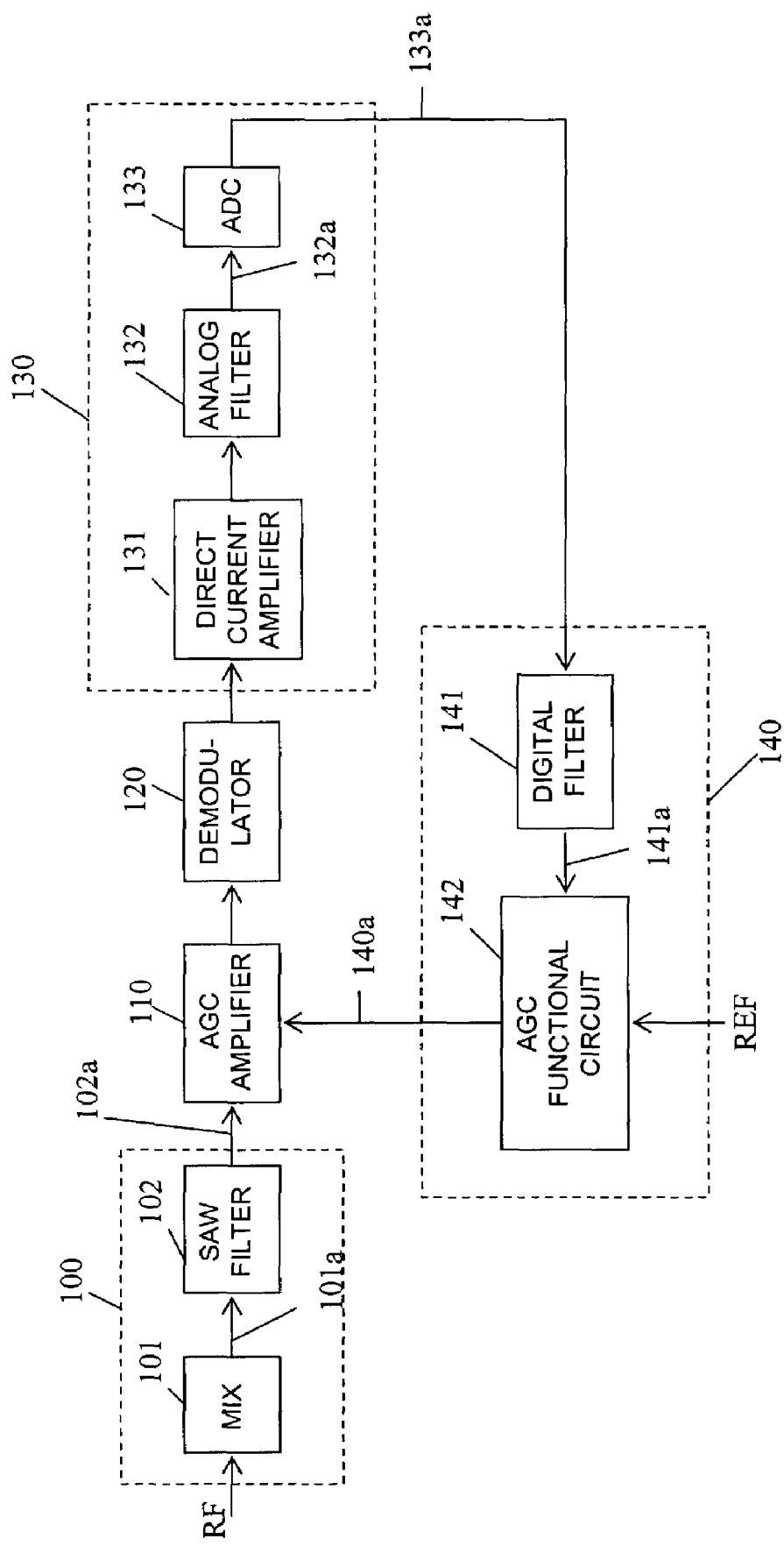
FIG. 1 is a block diagram of a receiver according to a first preferred embodiment of the present invention.

A receiver according to a first preferred embodiment of the present invention will be described with reference to FIG. 1. FIG. 1 is a block diagram of the receiver according to the first preferred embodiment of the present invention. The receiver according to the first preferred embodiment of the present invention comprises a converter 100, an auto gain controller amplifier (AGC amplifier) 110, a demodulator 120, a converter 130 and an AGC circuit 140.

The converter 100 comprises a mixer 101 and a surface acoustic wave (SAW) filter 102. The mixer 101 converts a frequency of a received signal RF from a radio frequency to an intermediate frequency, and outputs a signal 101a. If the receiver is in a double-superheterodyne system, the mixer 101 is a second receiving mixer of the system. The SAW filter 102 is coupled with the mixer 101. The SAW filter 102 passes a desired frequency band (desired channel signal) 102a of the signal 101a by attenuating other frequency bands (adjacent channel, noise).

The AGC amplifier 110 is coupled with the SAW filter 102. The AGC amplifier 110 is responsive to a control signal 140a to amplify the desired channel signal (input signal) 102a.

The demodulator 120 is coupled with the AGC amplifier 110. The demodulator 120 demodulates the input signal 102a to generate an in-phase component (first component) I and a quadrature phase component (second component) Q.

The converter 130 is coupled with the demodulator 120. The converter 130 comprises a direct-current amplifier 131, an analog filter 132 and an analog-to-digital converter (ADC) 133. The direct-current amplifier 131 is coupled with the demodulator 120. The direct-current amplifier 131 amplifies the in-phase component I and the quadrature phase component Q. The analog filter 132 is coupled with the direct-current amplifier 131. The amplified in-phase component I and quadrature phase component Q have amplification-induced noise. Accordingly, the analog filter 132 removes the noise in the respective amplified in-phase component I and quadrature phase component Q, and generates the first samples 132a. The first samples 132a are the in-phase component I and the quadrature phase component Q having no noise. The ADC 133 is coupled with the analog filter 132. The ADC 133 converts the first samples 132a from analog to digital. The ADC 133 outputs digitalized first samples 133a which comprise a data I showing an amplitude value of the in-phase component I and a data Q showing an amplitude value of the quadrature phase component Q.

The AGC circuit 140 is coupled with the converter 130. The AGC circuit 140 comprises a digital filter 141 and an AGC functional circuit 142. The digital filter 141 is coupled with the ADC 133, and is a narrowband low-pass filter. The digital filter 141 passes a desired frequency band (desired channel signal) of the digitalized first samples 132a by removing other frequency bands (adjacent channel, noise). The digital filter 141 generates second samples 141a which comprise the data I and data Q having no noise. The AGC functional circuit 142 is coupled with the digital filter 141, and generates the control signal 140a according to a power P1 of the second samples 141a. The AGC functional circuit 142 determines the power P1 of the second samples 141a per cycle in accordance with the following equation:

$$\Sigma(I^2+Q^2)^{1/2}$$

wherein I is the digitalized in-phase component in the second samples 141a, and Q is the digitalized quadrature phase component in the second samples 141a. The AGC functional circuit 142 generates a difference between the power P1 and a threshold value REF. Then, the AGC functional circuit 142 generates the control signal 140a corresponding to the difference.

In the receiver according to the first preferred embodiment of the present invention, the digital filter 141 is provided after the ADC 133. The second samples 141a are the digitalized in-phase component I and the digitalized quadrature phase component Q having no noise. The control signal 140a is generated corresponding to the second samples 141a. Then, the AGC amplifier 110 amplifies the input signal 102a corresponding to the control signal 140a. Accordingly, even though a level of the adjacent channel signal (noise) is large, a level of the first samples 132a is constant. Therefore, in the receiver according to the first preferred embodiment of the present invention, the level of the first samples 132a is not less than a resolution of the ADC 133.

Figure 2:
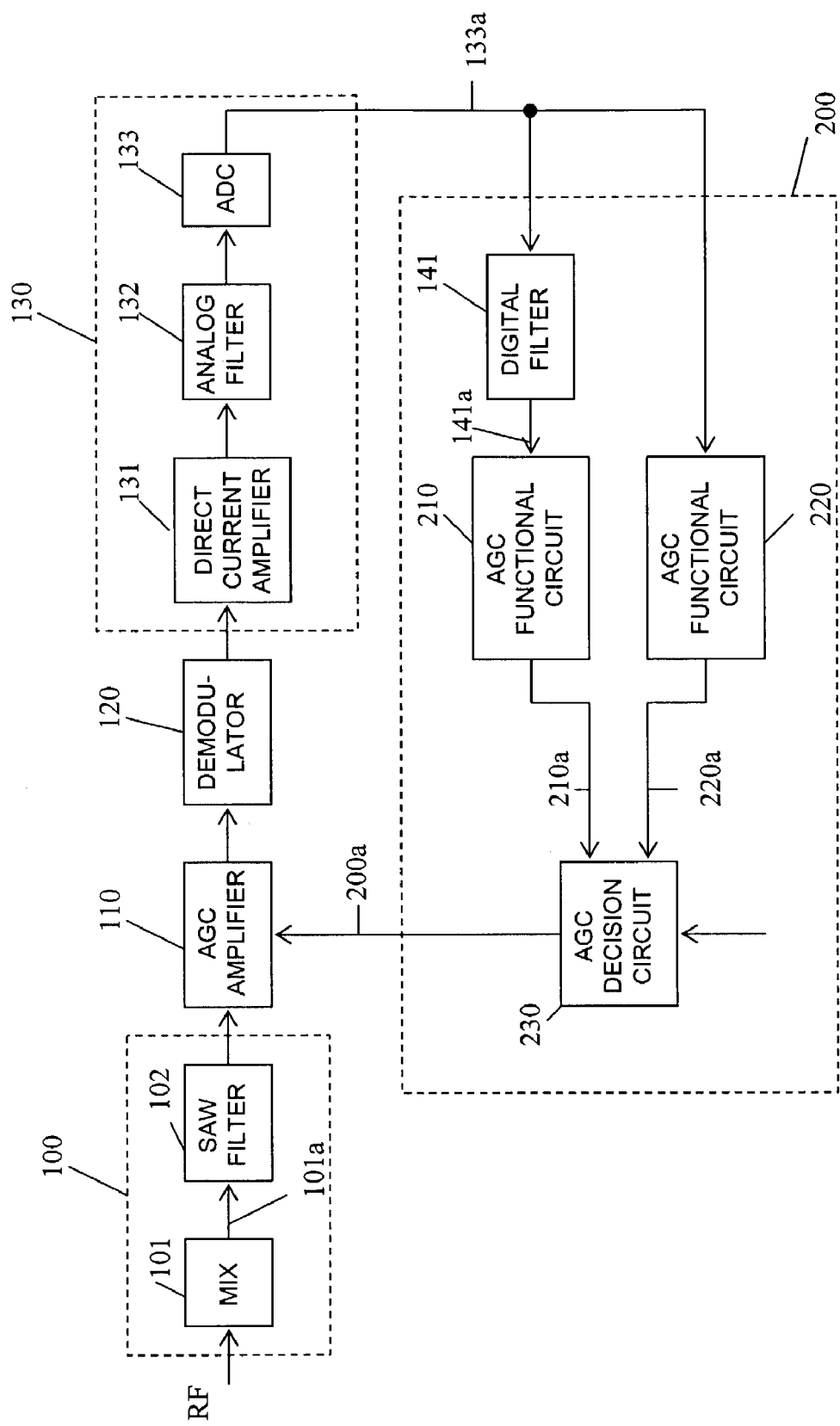
FIG. 2 is a block diagram of a receiver according to a second preferred embodiment of the present invention.

A receiver according to a second preferred embodiment of the present invention will be described with reference to FIG. 2. FIG. 2 is a block diagram of the receiver according to the second preferred embodiment of the present invention. Like elements are given like or corresponding reference numerals in the first and second preferred embodiments. Thus, dual explanations of the same elements are avoided.

The receiver according to the second preferred embodiment of the present invention comprises the converter 100, the AGC amplifier 110, the demodulator 120, the converter 130 and an AGC circuit 200.

The AGC circuit 200 is coupled with the converter 130. The AGC circuit 200 comprises the digital filter 141, AGC functional circuits 210 and 220 and an AGC decision circuit 230. The AGC functional circuit 210 is coupled with the digital filter 141, and generates a power 210a of the second samples 141a. The AGC functional circuit 210 determines the power 210a of the second samples 141a per cycle in accordance with the following equation:

$$\Sigma(I^2+Q^2)^{1/2}$$

wherein I is the digitalized in-phase component in the second samples 141a, and Q is the digitalized quadrature phase component in the second samples 141a. The AGC functional circuit 220 is coupled with the ADC 133, and generates a power 220a of the digitalized first samples 133a. The AGC functional circuit 220 determines the power 220a of the digitalized first samples 133a per cycle in accordance with the following equation:

$$\Sigma(I^2+Q^2)^{1/2}$$

wherein I is the in-phase component in the digitalized first samples 133a, and Q is the quadrature phase component in the digitalized first samples 133a. The AGC decision circuit 230 is coupled with the AGC functional circuits 210 and 220. The AGC decision circuit 230 generates a control signal 200a corresponding to the powers 210a and 220a.

Figure 3:
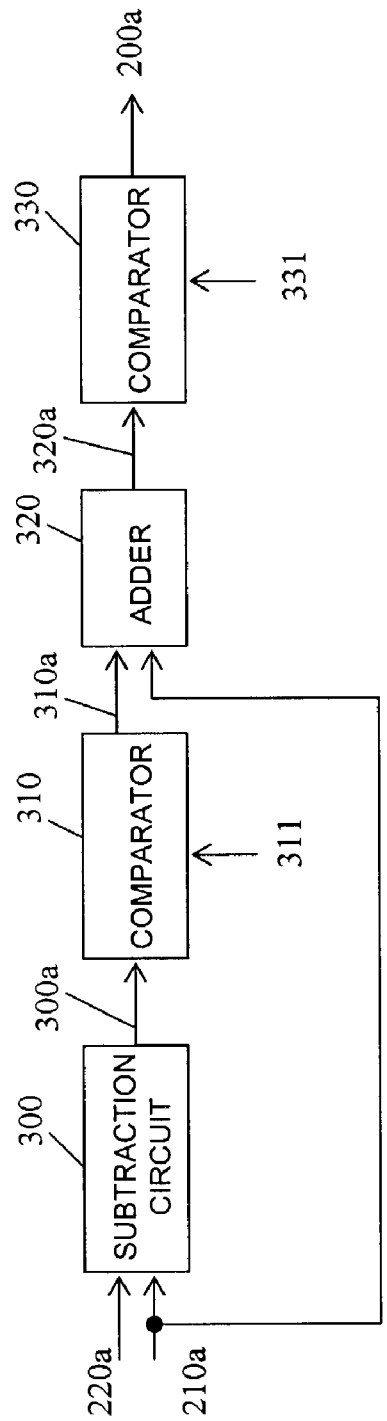
FIG. 3 is a block diagram of an AGC decision circuit of the receiver according to the second preferred embodiment of the present invention.

The AGC decision circuit 230 will be described with reference to FIGS. 3–4. FIG. 3 is a block diagram of the AGC decision circuit of the receiver according to the second preferred embodiment of the present invention. Also, FIG. 4 is a block diagram of an alternative AGC decision circuit of the receiver according to the second preferred embodiment of the present invention.

In FIG. 3, the AGC decision circuit 230 comprises a subtraction circuit 300, a comparator 310, an adder 320 and a comparator 330. The subtraction circuit 300 is coupled with the AGC functional circuits 210 and 220. The subtraction circuit 300 subtracts the power 210a from the power 220a to generate a power 300a of the adjacent channel signal (noise). The comparator 310 is coupled with the subtraction circuit 300. The comparator 310 compares the power 300a and a threshold value 311. The comparator 310 outputs the power 300a as a comparison result 310a when the power 300a is greater than the threshold value 311. It is possible that a level of the power 300a is changed as the case may be. The adder 320 is coupled with the comparator 310. The adder 320 adds the comparison result 310a and the power 210a, and outputs an addition result 320a. The adder 320 outputs the power 210a as the addition result 320a when the power 300a is less than the threshold value 311. The adder 320 outputs the addition result 320a which is the sum of the comparison result 310a and the power 210a when the power 300a is greater than the threshold value 311. The comparator 330 is coupled with the adder 320. The comparator 330 calculates a difference between the addition result 320a and a threshold value 331. The comparator 330 generates the control signal 200a corresponding to the difference.

Figure 4:
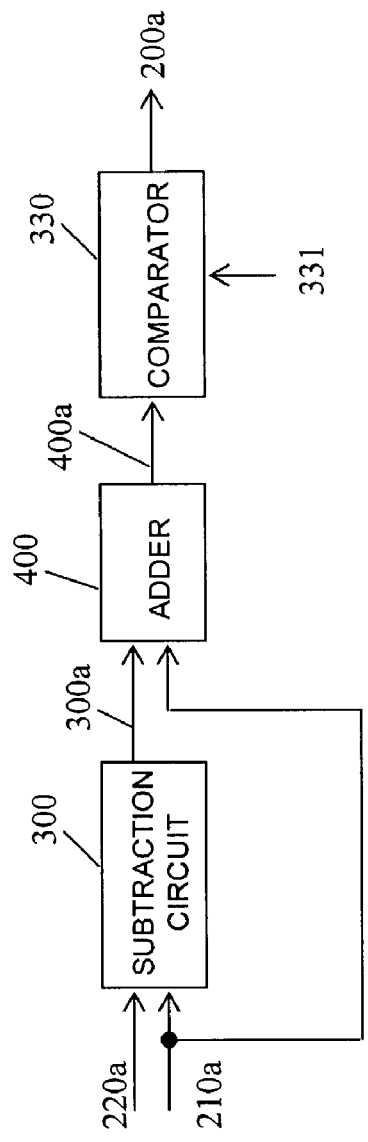
FIG. 4 is a block diagram of an alternative AGC decision circuit of the receiver according to the second preferred embodiment of the present invention.

In FIG. 4, the AGC decision circuit 230 comprises the subtraction circuit 300, an adder 400 and the comparator 330. The adder 400 is coupled with the subtraction circuit 300. The adder 400 adds the power 210a and the power 300a, and outputs an addition result 400a. The comparator 330 is coupled with the adder 400. The comparator 330 calculates a difference between the addition result 400a and the threshold value 331. The comparator 330 generates the control signal 200a corresponding to the difference.

The receiver according to the second preferred embodiment of the present invention decides that a non-linear distortion of the analog adjacent channel signal does not occur when the power 300a is less than the threshold value 311. The AGC amplifier 110 is controlled according to the power 210a of the desired channel signal. Therefore, in the receiver according to the second preferred embodiment of the present invention, the level of the first samples 132a is not less than a resolution of the ADC 133. On the other hand, the receiver according to the second preferred embodiment of the present invention decides that a non-straight line strain of the analog adjacent channel signal probably occurs when the power 300a is greater than the threshold value 311. The AGC amplifier 110 is controlled according to the addition results 320a and 400a. Therefore, the receiver according to the second preferred embodiment of the present invention prevents the non-linear distortion of the analog adjacent channel signal from occurring.

Thereby, the AGC decision circuit 230 prevents an aggravation of an error rate of the desired channel signal caused by the adjacent channel signal. Therefore, it is possible that the AGC decision circuit 230 is enabled when the receiver is a connecting mode and the AGC decision circuit 230 is not enabled when the receiver is a waiting mode.

Figure 5:
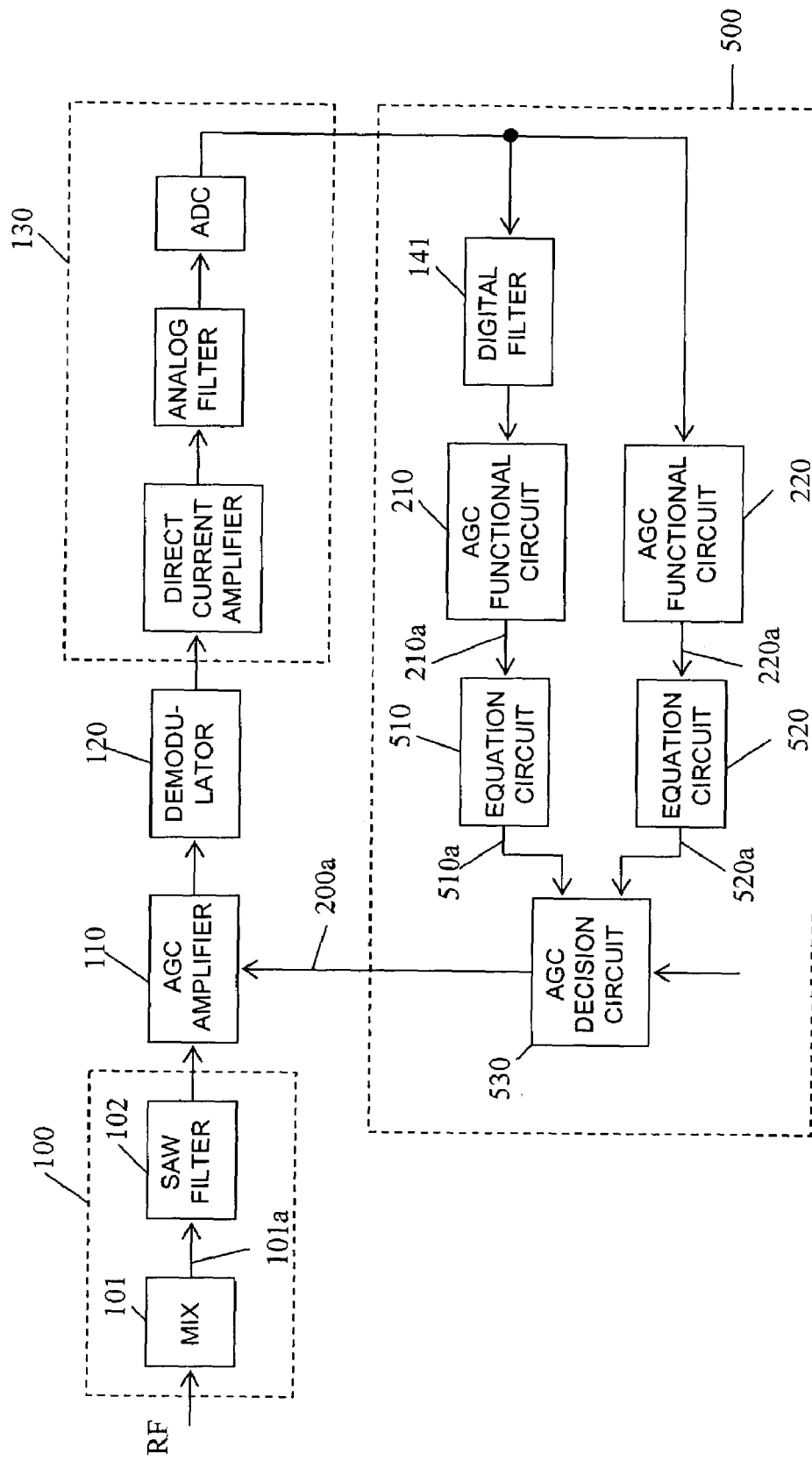
FIG. 5 is a block diagram of a receiver according to a third preferred embodiment of the present invention.

A receiver according to a third preferred embodiment of the present invention will be described with reference to FIG. 5. FIG. 5 is a block diagram of the receiver according to the third preferred embodiment of the present invention. Like elements are given like or corresponding reference numerals in the above preferred embodiments. Thus, dual explanations of the same elements are avoided.

The receiver according to the third preferred embodiment of the present invention comprises the converter 100, the AGC amplifier 110, the demodulator 120, the converter 130 and an AGC circuit 500.

The AGC circuit 500 is coupled with the converter 130. The AGC circuit 500 comprises the digital filter 141, AGC functional circuits 210 and 220, equation circuits 510 and 520 and an AGC decision circuit 530.

The equation circuit 510 is coupled with the AGC functional circuits 210. The equation circuit 510 calculates an average of the power 210a, and generates a control pulse 510a. A cycle of the control pulse 510a is an integral multiple of a cycle of the power 210a. The equation circuit 520 is coupled with the AGC functional circuits 220. The equation circuit 520 calculates an average of the power 220a, and generates a control pulse 520a. A cycle of the control pulse 520a is an integral multiple of a cycle of the power 220a.

Figure 6:
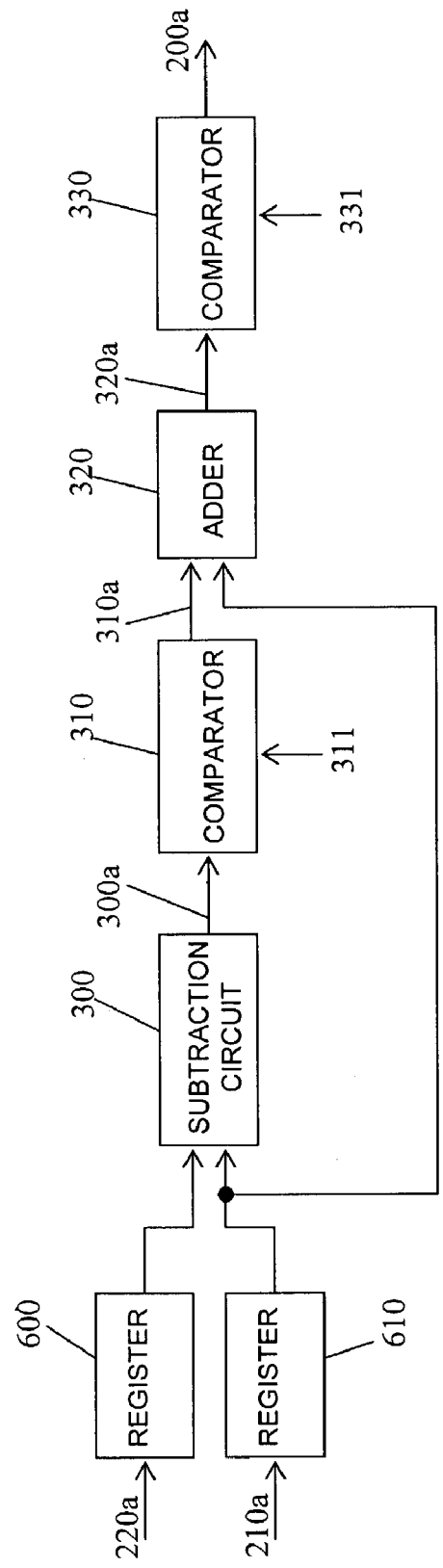
FIG. 6 is a block diagram of an AGC decision circuit of the receiver according to the third preferred embodiment of the present invention.

The AGC decision circuit 530 will be described with reference to FIGS. 6–7. FIG. 6 is a block diagram of the AGC decision circuit of the receiver according to the third preferred embodiment of the present invention. Also, FIG. 7 is a block diagram of an alternative AGC decision circuit of the receiver according to the third preferred embodiment of the present invention.

In FIG. 6, the AGC decision circuit 530 comprises registers 600 and 610, the subtraction circuit 300, the comparator 310, the adder 320 and the comparator 330. The register 600 stores a previously calculated power 220a, and the register 610 stores a previously calculated power 210a. The AGC decision circuit 530 generates the control signal 200a corresponding to the previously calculated powers 210a and 220a.

Figure 7:
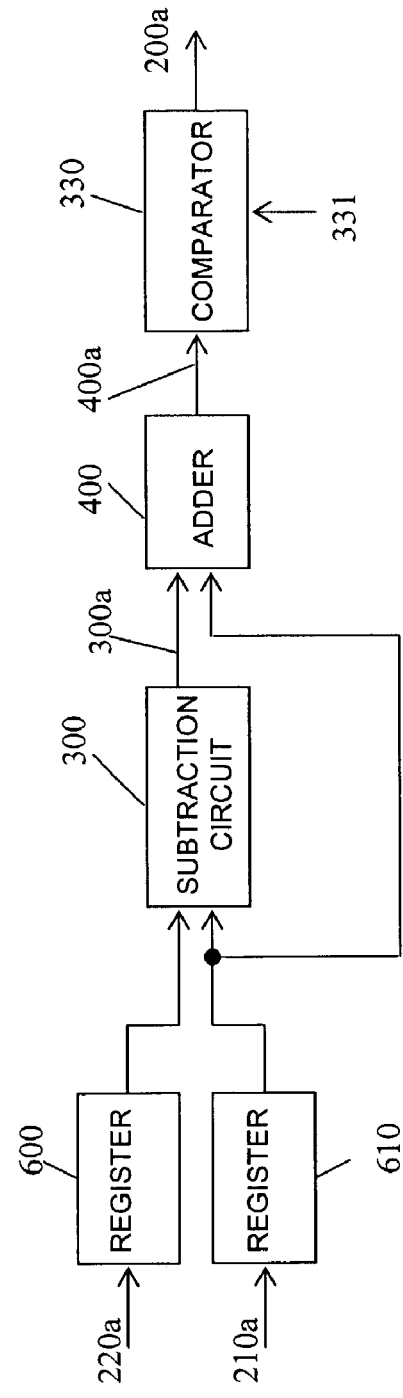
FIG. 7 is a block diagram of an alternative AGC decision circuit of the receiver according to the third preferred embodiment of the present invention.

In FIG. 7, the AGC decision circuit 530 comprises the registers 600 and 610, the subtraction circuit 300, the adder 400 and the comparator 330. The AGC decision circuit 530 generates the control signal 200a corresponding to the previously calculated powers 210a and 220a.

In the receiver according to the third preferred embodiment of the present invention, a level of the receiving signal is time-wise variable due to phasing, and the variability depends on a carrier frequency. When time taken at the equation circuit 510 is shorter than time taken at the equation circuit 520, the AGC circuit 500 follows a phasing of the desired channel signal. Therefore, the receiver according to the third preferred embodiment of the present invention controls an analog gain corresponding to the phasing.

Thereby, the AGC decision circuit 530 prevents an aggravation of an error rate of the desired channel signal caused by the adjacent channel signal. Therefore, it is possible that the AGC decision circuit 530 is enabled when the receiver is a connecting mode and the AGC decision circuit 530 is not enabled when the receiver is a waiting mode.

Figure 8:
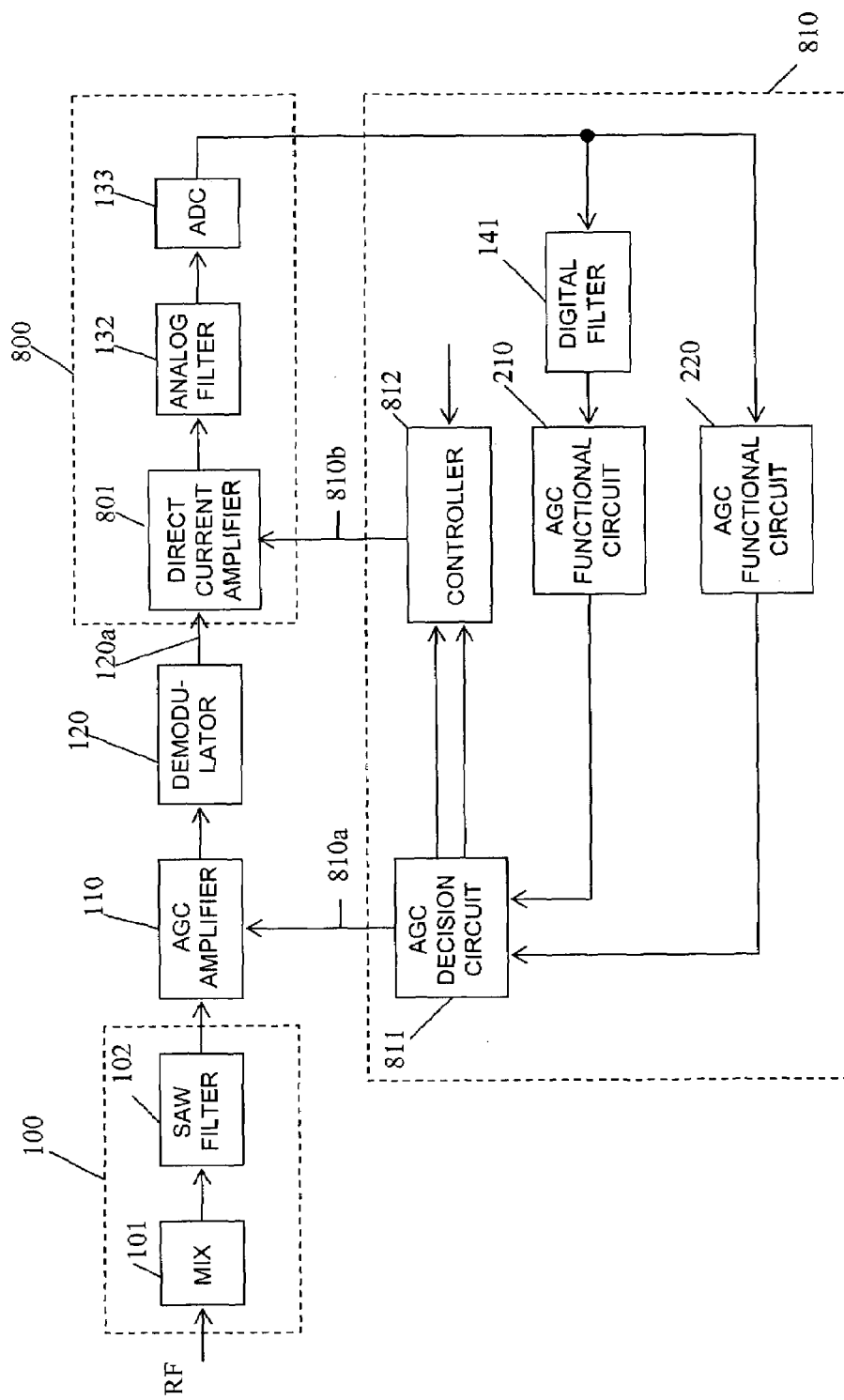
FIG. 8 is a block diagram of a receiver according to a fourth preferred embodiment of the present invention.

A receiver according to a fourth preferred embodiment of the present invention will be described with reference to FIG. 8. FIG. 8 is a block diagram of the receiver according to the fourth preferred embodiment of the present invention. Like elements are given like or corresponding reference numerals in the above preferred embodiments. Thus, dual explanations of the same elements are avoided.

The receiver according to the fourth preferred embodiment of the present invention comprises the converter 100, the AGC amplifier 110, the demodulator 120, a converter 800 and an AGC circuit 810.

The converter 800 is coupled with the demodulator 120. The converter 800 comprises a direct-current amplifier 801, the analog filter 132 and the ADC 133. The direct-current amplifier 801 is coupled with the demodulator 120. The direct-current amplifier 801 has a variable attenuator for attenuating the input signal 102a. The direct-current amplifier 801 switches an attenuation amount to a first attenuation amount or a second attenuation amount corresponding to a switching signal 810b. The variable attenuator does not comprise a time constant circuit, but a resister element and a switch element. Therefore, the direct-current amplifier 801 rapidly switches the attenuation amount.

The AGC circuit 810 is coupled with the converter 800. The AGC circuit 810 comprises the digital filter 141, AGC functional circuits 210 and 220, an AGC decision circuit 811 and a controller 812.

Figure 9:
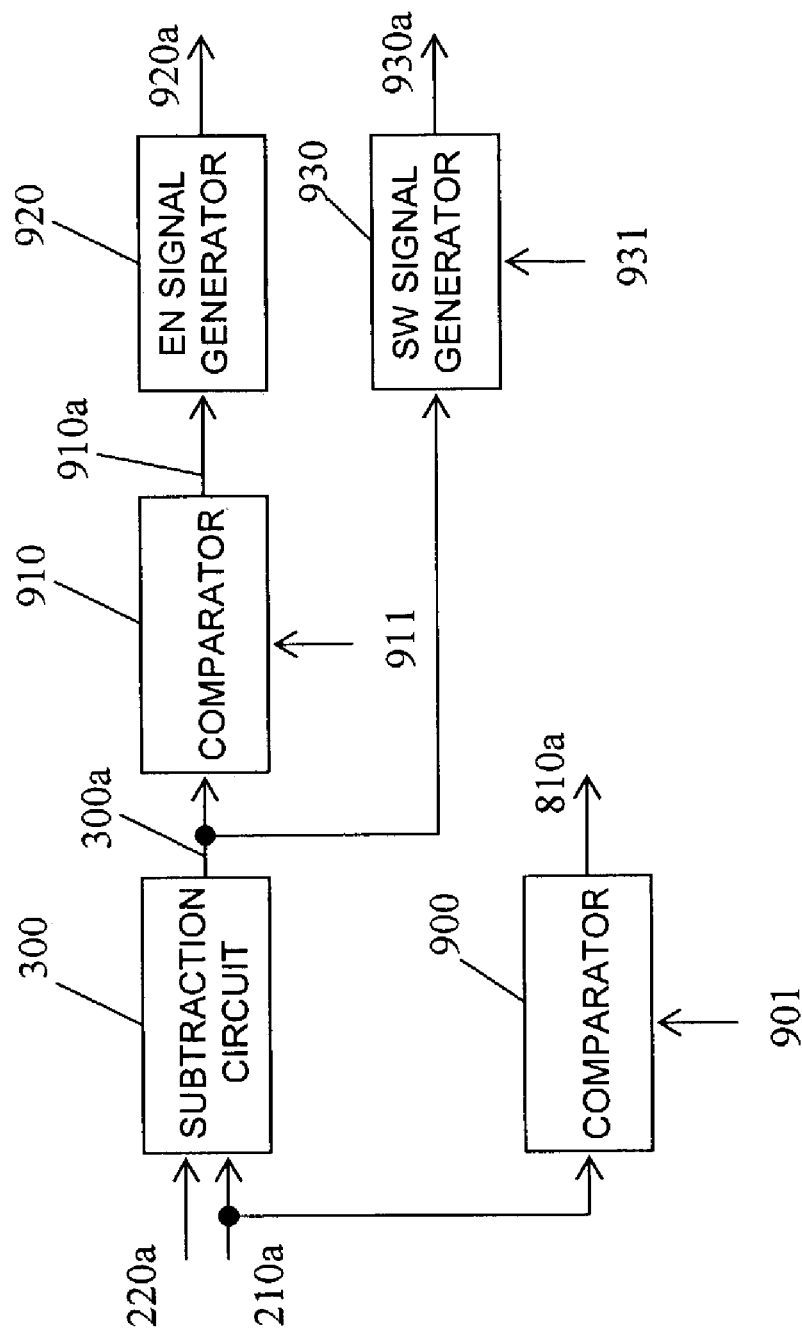
FIG. 9 is a block diagram of the AGC decision circuit of the receiver according to the fourth preferred embodiment of the present invention.

The AGC decision circuit 811 will be described with reference to FIG. 9. FIG. 9 is a block diagram of the AGC decision circuit of the receiver according to the fourth preferred embodiment of the present invention. The AGC decision circuit 811 comprises the subtraction circuit 300, comparators 900 and 910, an EN signal generator 920 and a SW signal generator 930. The comparator 900 is coupled with the AGC functional circuit 210. The comparator 900 compares the power 210a and a threshold value 901, and generates a control signal 810a. The comparator 910 is coupled with the subtraction circuit 300. The comparator 910 compares the power 300a and a threshold value 911, and generates an enable signal 910a when the power 300a passes the threshold value 911. The EN signal generator 920 is coupled with the comparator 910. The EN signal generator 920 generates an enable signal 920a to enable the direct-current amplifier 801 to change an attenuation amount as specified by a switch signal 930a when the enable signal 910a is an enable state. The SW signal generator 930 is coupled with the subtraction circuit 300. The SW signal generator 930 generates a switch signal 930a for instructing the first attenuation amount when the power 300a is less than a threshold value 931 and for instructing the second attenuation amount when the power 300a is greater than the threshold value 931. The first attenuation amount is less than the second attenuation amount.

The controller 812 is coupled with the AGC decision circuit 811, and comprises a timing clock generator and a SW signal output circuit. The timing clock generator generates a timing clock which has a phase difference of a half of a sampling clock 812a. When the enable signal 920a having an enable state is input, the controller 812 generates a switch timing signal synchronized with the timing clock. When the switch timing signal is an enable state, the SW signal output circuit outputs the switch signal 930a as a control signal 810b.

In the receiver according to the fourth preferred embodiment of the present invention, the direct-current amplifier 801 has a variable attenuator which does not comprise a time constant circuit. The direct-current amplifier 801 changes the attenuation amount of the variable attenuator corresponding to the power 300a. Therefore, the receiver according to the fourth preferred embodiment of the present invention controls an analog gain corresponding to the phasing by rapidly changing the variable attenuator of the direct-current amplifier.

Figure 10:
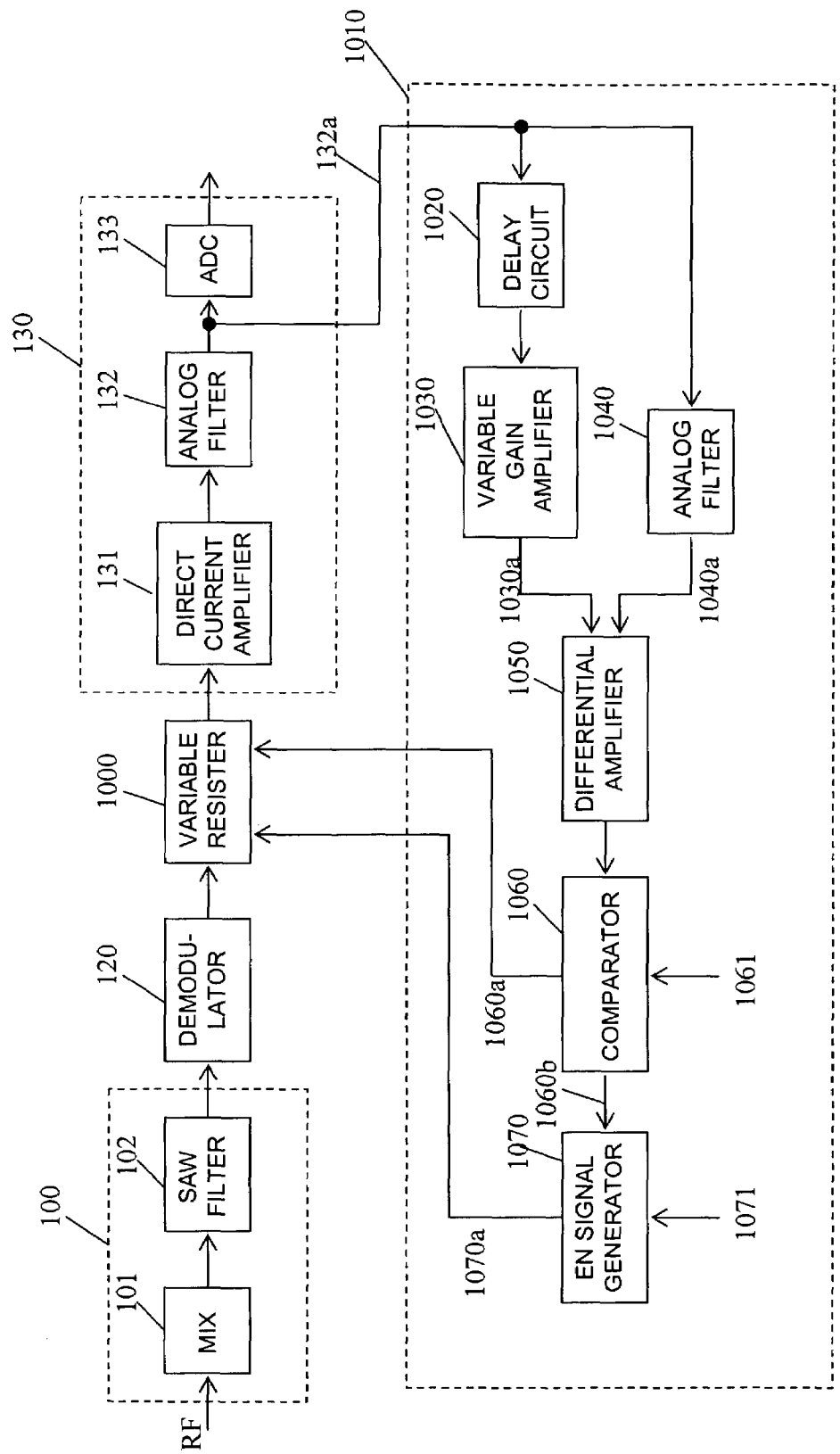
FIG. 10 is a block diagram of a receiver according to a fifth preferred embodiment of the present invention.

A receiver according to a fifth preferred embodiment of the present invention will be described with reference to FIG. 10. FIG. 10 is a block diagram of the receiver according to the fifth preferred embodiment of the present invention. Like elements are given like or corresponding reference numerals in the above preferred embodiments. Thus, dual explanations of the same elements are avoided.

The receiver according to the fifth preferred embodiment of the present invention comprises the converter 100, the demodulator 120, a variable resister 1000, the converter 130 and an AGC circuit 1010.

The variable resister 1000 is coupled with the demodulator 120. The variable resister 1000 has a variable attenuator for attenuating the in-phase component I and the quadrature phase component Q. The variable resister 1000 switches an attenuation amount to a first attenuation amount or a second attenuation amount corresponding to a switching signal 1060a when an EN signal 1070a is input. The first attenuation amount is less than the second attenuation amount.

The AGC circuit 1010 is coupled with the converter 130. The AGC circuit 1010 comprises a delay circuit 1020, a variable gain amplifier 1030, an analog filter 1040, a differential amplifier 1050, a comparator 1060 and an EN signal generator 1070.

The delay circuit 1020 is coupled with the analog filter 132. The delay circuit 1020 causes the first samples 132a to be delayed for a certain period. The variable gain amplifier 1030 is coupled with the delay circuit 1020. The variable gain amplifier 1030 adjusts the amplitude and phase of the first samples 132a and a third samples 1040 output by the analog filter 1040 to be same. The analog filter 1040 is coupled with the analog filter 132. The analog filter 1040 removes noise (adjacent channel signal components) from the first samples 132a, and generates the third samples (desired channel signal components) 1040a. The differential amplifier 1050 is coupled with the variable gain amplifier 1030 and the analog filter 1040. The differential amplifier 1050 generates a difference between the adjusted first samples 1030a and the third samples 1040a, causing a noise amount (adjacent channel signal components) to be determined. The comparator 1060 is coupled with the differential amplifier 1050. The comparator 1060 detects a peak value of the noise amount and compares the peak value and a threshold value 1061. The comparator 1060 generates the switching signal 1060a for instructing the attenuation amount of the variable resister 1000 to be the second attenuation amount when the peak value of the noise amount is greater than the threshold value 1061. The comparator 1060 generates the switching signal 1060a for instructing the attenuation amount to be the first attenuation amount when the peak value of the noise amount is less than the threshold value 1061. Also, the comparator 1060 generates a carry signal 1060b for instructing the EN signal 1070a to be generated. It is possible that the noise amount may be integrated instead of detecting the peak value. The EN signal generator 1070 is coupled with the comparator 1060. The EN signal generator 1070 generates a timing clock of which a phase shift is a half compared with a phase of a sampling clock 1071 being supplied with the ADC 133. When the carry signal 1060b is input, the EN signal generator 1070 generates the EN signal 1070a synchronizing with the timing clock. The attenuation amount of the variable resister 1000 is switched at intervals of the sampling clock 1071. Therefore, switching the attenuation amount does not influence a sampling operation of the ADC 133.

In the receiver according to the fifth preferred embodiment of the present invention, the AGC circuit comprises analog circuits. Therefore, a scale of digital circuits according to the fifth preferred embodiment of the present invention is reduced.

Figure 11:
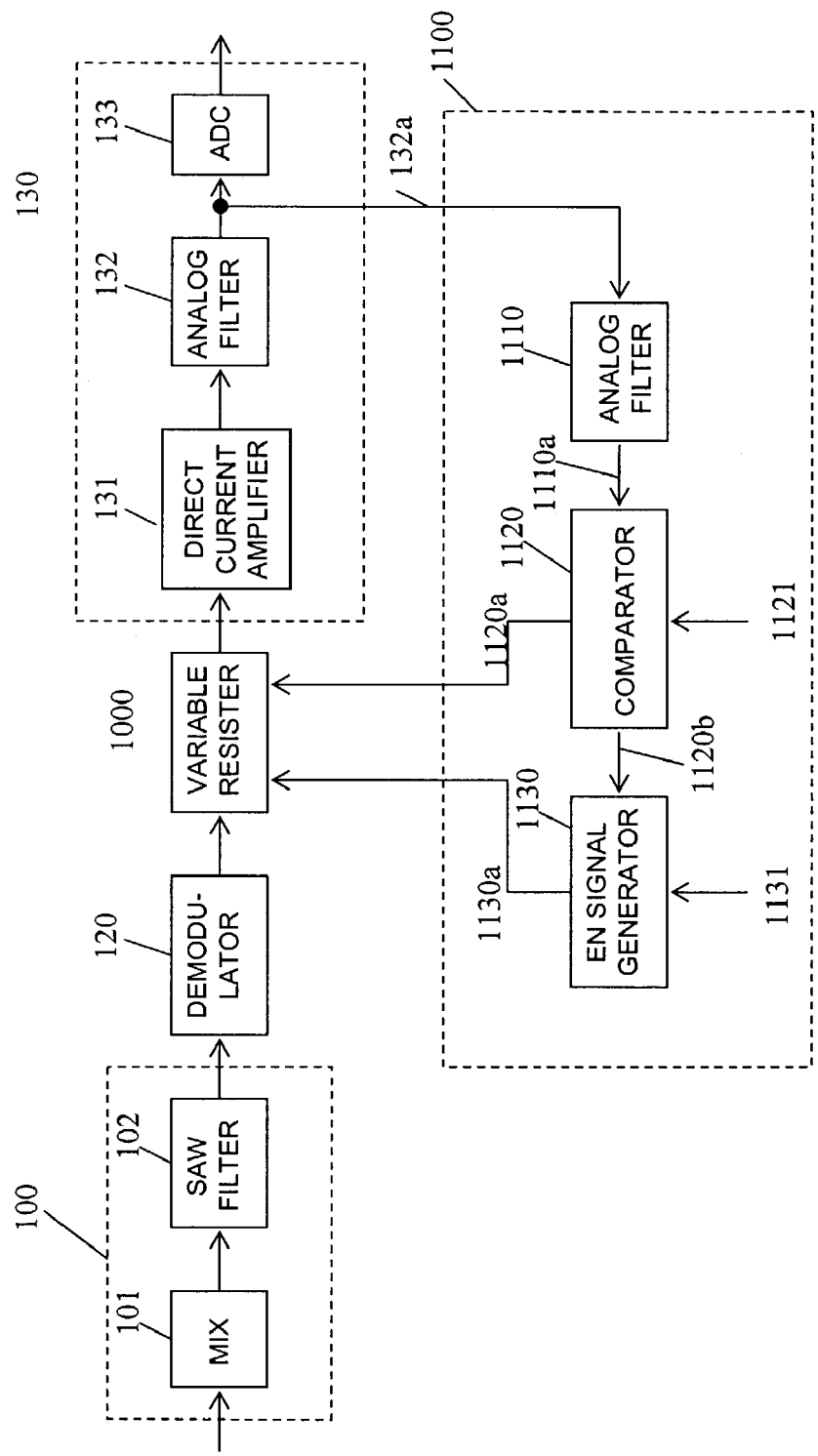
FIG. 11 is a block diagram of a receiver according to a sixth preferred embodiment of the present invention.

A receiver according to a sixth preferred embodiment of the present invention will be described with reference to FIG. 11. FIG. 11 is a block diagram of the receiver according to the sixth preferred embodiment of the present invention. Like elements are given like or corresponding reference numerals in the above preferred embodiments. Thus, dual explanations of the same elements are avoided.

The receiver according to the sixth preferred embodiment of the present invention comprises the converter 100, the demodulator 120, the variable resister 1000, the converter 130 and an AGC circuit 1100.

The AGC circuit 1100 is coupled with the converter 130. The AGC circuit 1100 comprises an analog filter 1110, a comparator 1120 and an EN signal generator 1130.

The analog filter 1110 is coupled with the analog filter 132. The analog filter 1110 is a high-pass filter. The analog filter 1110 removes the desired channel signal components from the first samples 132a, and generates the fourth samples (adjacent channel signal components, noise) 1110a. The comparator 1120 is coupled with the analog filter 1110. The comparator 1120 detects a peak value of the fourth samples 1110a, and compares the peak value and a threshold value 1121. The comparator 1120 generates a switching signal 1120a for instructing the attenuation amount of the variable resister 1000 to be the second attenuation amount when the peak value of the fourth samples 1110a is greater than the threshold value 1121. The comparator 1120 generates the switching signal 1120a for instructing the attenuation amount to be the first attenuation amount when the peak value of the fourth samples 1110a is less than the threshold value 1121. Also, the comparator 1120 generates a carry signal 1120b for instructing an EN signal 1130a to be generated. The EN signal generator 1130 is coupled with the comparator 1120. The EN signal generator 1130 generates a timing clock of which a phase shift is a half compared with a phase of a sampling clock 1131 being supplied with the ADC 133. When the carry signal 1120b is input, the EN signal generator 1130 generates the EN signal 1130a synchronizing with the timing clock. The attenuation amount of the variable resister 1000 is switched at intervals of the sampling clock 1131. Therefore, switching the attenuation amount does not influence a sampling operation of the ADC 133.

In the receiver according to the sixth preferred embodiment of the present invention, the AGC circuit comprises the analog filter, the comparator and the EN signal generator. Therefore, a scale of the AGC circuit according to the sixth preferred embodiment of the present invention is reduced.

Figure 12:
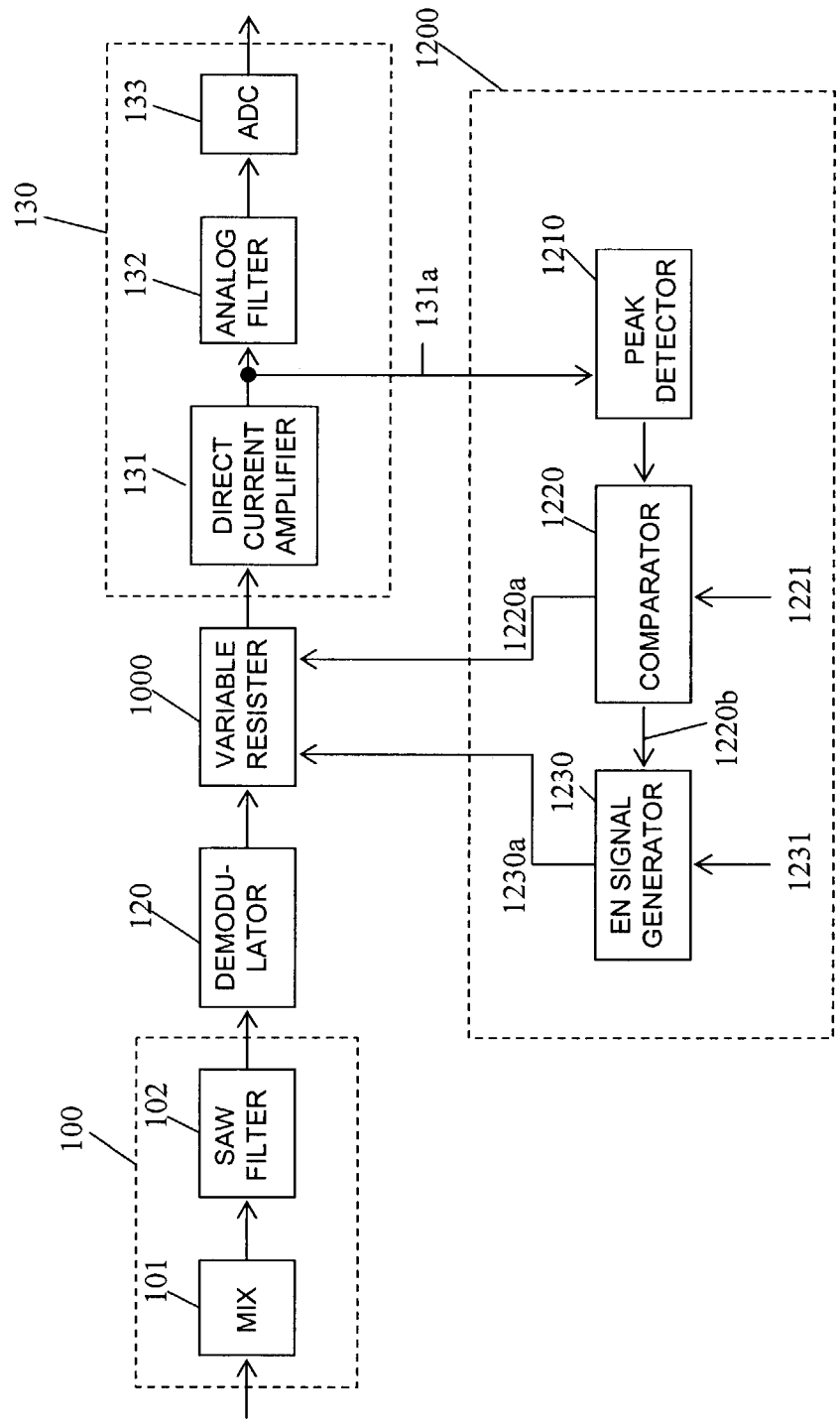
FIG. 12 is a block diagram of a receiver according to a seventh preferred embodiment of the present invention.

A receiver according to a seventh preferred embodiment of the present invention will be described with reference to FIG. 12. FIG. 12 is a block diagram of the receiver according to the seventh preferred embodiment of the present invention. Like elements are given like or corresponding reference numerals in the above preferred embodiments. Thus, dual explanations of the same elements are avoided.

The receiver according to the seventh preferred embodiment of the present invention comprises the converter 100, the demodulator 120, the variable resister 1000, the converter 130 and an AGC circuit 1200.

The AGC circuit 1200 is coupled with the converter 130. The AGC circuit 1200 comprises a peak detector 1210, a comparator 1220 and an EN signal generator 1230.

The peak detector 1210 is coupled with the direct-current amplifier 131. The peak detector 1210 detects a peak value of the amplified signal 131a (amplified in-phase component I and quadrature phase component Q). The comparator 1220 samples the peak value using a sampling clock which is supplied with the ADC 133. When the sampled peak values are consecutively greater than a threshold value 1221 more than a given number of times (N times), the comparator 1220 generates a SW signal 1220a for instructing the attenuation amount of the variable resister 1000 to be the second attenuation amount. Otherwise, the comparator 1220 generates the SW signal 1220a for instructing the attenuation amount to be the first attenuation amount. Also, the comparator 1220 generates a carry signal 1220b for instructing an EN signal 1230a to be generated. The EN signal generator 1230 generates a timing clock of which a phase shift is a half compared with a phase of a sampling clock 1231 being supplied with the ADC 133. When the carry signal 1220b is input, the EN signal generator 1230 generates the EN signal 1230a synchronized with the timing clock. The attenuation amount of the variable resister 1000 is switched at intervals of the sampling clock 1231. Therefore, switching the attenuation amount does not influence a sampling operation of the ADC 133.

In the receiver according to the seventh preferred embodiment of the present invention, the AGC circuit comprises the peak detector, the comparator and the EN signal generator. Therefore, a scale of the AGC circuit according to the seventh preferred embodiment of the present invention is reduced.

While the preferred form of the present invention has been described, it is to be understood that modifications will be apparent to those skilled in the art without departing from the spirit of the invention.

The scope of the invention, therefore, is to be determined solely by the following claims.

What is claimed:

1. A receiver, comprising:
   an amplifier which is responsive to a control signal to amplify an input signal, and which outputs a corresponding amplified signal;
   a demodulator, coupled with the amplifier, which demodulates the amplified signal to generate first and second components;
   a converter, coupled with the demodulator, which generates first samples corresponding to the respective first and second components, and which digitalizes the first samples; and
   an auto gain controller (AGC), coupled with the converter, which generates second samples corresponding to the digitalized first samples, and which generates the control signal responsive to the second samples,
   wherein said AGC comprises
      a digital filter which passes a predetermined signal component of the digitalized first samples to generate the second samples, and
      an AGC functional circuit which determines a power of the second samples, compares the power to a threshold level, and generates the control signal responsive to the comparison.

2. The receiver according to claim 1, wherein said AGC functional circuit determines the power of the second samples in accordance with the following equation:

$$\Sigma(I^2+Q^2)^{1/2},$$

wherein I is a first component in the second samples, and Q is a second component in the second samples.

3. The receiver according to claim 1, wherein said converter comprises:
   a direct-current amplifier which amplifies the first and second components;
   an analog filter which removes noise in the amplified first and second components to generate the first samples; and
   an analog-to-digital converter (ADC) which converts the first samples from analog to digital to provide the digitalized first samples.

4. The receiver according to claim 1, wherein said converter is a first converter, and wherein the input signal is generated by a second converter, the second converter comprising:
   a mixer which converts a frequency of a received signal from a radio frequency to an intermediate frequency; and
   a saw filter which removes a noise in the converted received signal of the intermediate frequency to generate the input signal.

5. A receiver comprising:
   an amplifier which is responsive to a control signal to amplify an input signal, and which outputs a corresponding amplified signal;
   a demodulator, coupled with the amplifier, which demodulates the amplified signal to generate first and second components;
   a converter, coupled with the demodulator, which generates first samples corresponding to the respective first and second components, and which digitalizes the first samples; and
   an auto gain controller (AGC), coupled with the converter, which generates second samples corresponding to the digitalized first samples, and which generates the control signal responsive to the second samples,
   wherein said AGC comprises
      a digital filter which removes a noise in the digitalized first samples to generate the second samples,
      a first AGC functional circuit which generates a first power of the second samples,
      a second AGC functional circuit which generates a second power of the digitalized first samples, and
      an AGC decision circuit which generates the control signal corresponding to the first and second powers.

6. The receiver according to claim 5, wherein said AGC decision circuit comprises:
   a subtraction circuit which subtracts the first power from the second power to generate a third power;
   a first comparator which compares the third power and a first threshold value to generate a comparison result;
   an adder which adds the comparison result and the first power to generate an addition result; and
   a second comparator which compares the addition result and a second threshold value to generate the control signal.

7. The receiver according to claim 5, wherein said AGC decision circuit comprises:
   a subtraction circuit which subtracts the first power from the second power to generate a third power;
   an adder which adds the third power and the first power to generate an addition result; and
   a comparator which compares the addition result and a threshold value to generate the control signal.

8. A receiver comprising:
   an amplifier which is responsive to a control signal to amplify an input signal, and which outputs a corresponding amplified signal;

a demodulator, coupled with the amplifier, which demodulates the amplified signal to generate first and second components;

a converter, coupled with the demodulator, which generates first samples corresponding to the respective first and second components, and which digitalizes the first samples; and an auto gain controller (AGC), coupled with the converter, which generates second samples corresponding to the digitalized first samples, and which generates the control signal responsive to the second samples, wherein said AGC comprises a digital filter which removes a noise in the digitalized first samples to generate the second samples, a first AGC functional circuit which generates a first power of the second samples, a second AGC functional circuit which generates a second power of the digitalized first samples, a first equation circuit which calculates an average of the first power to generate a first control pulse, a second equation circuit which calculates an average of the second power to generate a second control pulse, and an AGC decision circuit which generates the control signal synchronized with the first and second pulses.

9. A receiver comprising:

an amplifier which is responsive to a control signal to amplify an input signal, and which outputs a corresponding amplified signal;

a demodulator, coupled with the amplifier, which demodulates the amplified signal to generate first and second components;

a converter, coupled with the demodulator, which generates first samples corresponding to the respective first and second components, and which digitalizes the first samples; and an auto gain controller (AGC), coupled with the converter, which generates second samples corresponding to the digitalized first samples, and which generates the control signal responsive to the second samples, wherein said converter comprises a direct-current amplifier which amplifies the first and second components, an analog filter which removes noise in the amplified first and second components to generate the first samples, and an analog-to-digital converter (ADC) which converts the first samples from analog to digital, wherein said control signal is a first control signal, and wherein said AGC comprises a digital filter which removes a noise in the digitalized first samples to generate the second samples, a first AGC functional circuit which generates a first power of the second samples, a second AGC functional circuit which generates a second power of the digitalized first samples, an AGC decision circuit which generates the first control signal and a second control signal synchronized with the first and second powers, and a controller which generates a third control signal responsive to the second control signal for controlling the direct-current amplifier.

10. The receiver according to claim 9, wherein the second control signal comprises an enable signal and a switch signal, and wherein said AGC decision circuit comprises:

a comparator which compares the first power and a first threshold value to generate the first control signal;

a subtraction circuit which subtracts the first power from the second power to generate a third power;

an enable signal generator which generates the enable signal according to a comparison result between the third power and a second threshold value; and a switch signal generator which generates the switch signal according to a comparison result between the third power and a third threshold value.

11. The receiver according to claim 10, wherein said enable signal generator generates the enable signal for enabling a switching of an attenuation amount of the direct-current amplifier when the third power substantially equals the second threshold value, and wherein said switch signal generator generates the switch signal for selecting the attenuation amount of the direct-current amplifier when the enable signal is generated.

12. The receiver according to claim 11, wherein said switch signal generator generates the switch signal for selecting a first attenuation amount when the third power is less than the third threshold value and for selecting a second attenuation amount when the third power is greater than the third threshold value, wherein the first attenuation amount is less than the second attenuation amount.

13. A receiver, comprising:

a demodulator which demodulates an input signal to generate first and second components;

a variable resister, coupled with the demodulator, which attenuates the first and second components responsive to first and second control signals;

a converter, coupled with the variable resister, which generates first samples corresponding to the attenuated first and second components; and an auto gain controller (AGC), coupled with the converter, which generates second samples corresponding to the first samples, which generates the first control signal and a carry signal according to at least one peak value of the second samples, and which generates the second control signal according to the carry signal.

14. The receiver according to claim 13, wherein said AGC comprises:

an analog filter which removes a noise in the first samples to generate the second samples;

a comparator which generates the first control signal and the carry signal according to a comparison of a threshold value and the at least one peak value of the second samples; and an enable signal generator which generates the second control signal according to the carry signal.

15. The receiver according to claim 14, wherein said comparator generates the first control signal for instructing a first attenuation amount when the at least one peak value is less than the threshold value and for instructing a second attenuation amount when the at least one peak value is greater than the threshold value.

16. A receiver comprising:

a demodulator which demodulates an input signal to generate first and second components;

a variable resister, coupled with the demodulator, which attenuates the first and second components responsive to first and second control signals;

a converter, coupled with the variable resister, which generates first samples corresponding to the attenuated first and second components; and an auto gain controller (AGC), coupled with the converter, which generates second samples corresponding to the first samples, which generates the first control signal and a carry signal according to at least one peak value of the second samples, and which generates the second control signal according to the carry signal, wherein said AGC comprises
- an analog filter which removes a noise in the first samples to generate the second samples,
- an adjuster circuit which adjusts an amplitude and phase of the first samples to the generate adjusted first samples,
- a differential amplifier which generates a difference between the second samples and the adjusted first samples to determine a noise amount,
- a comparator which generates the first control signal and the carry signal according to a comparison of a threshold value and a peak value of the noise amount, and
- an enable signal generator which generates the second control signal according to the carry signal.

17. A receiver, comprising:
a demodulator which demodulates an input signal to generate first and second components;
a variable resister, coupled with the demodulator, which attenuates the first and second components responsive to first and second control signals;
a direct-current amplifier, coupled with the variable resister, which amplifies the attenuated first and second components; and
an auto gain controller (AGC), coupled with the direct-current amplifier, which generates at least one peak value of the amplified first and second components, which generates the first control signal and a carrier signal responsive to the peak value and a threshold value, and which generates the second control signal corresponding to the carrier signal.

18. A method for generating a control signal, comprising:
amplifying an input signal according to a control signal;
demodulating an amplified signal to generate first and second components;
generating first samples corresponding to the respective first and second components;
digitalizing the first samples;
generating second samples corresponding to the digitalized first samples; and
generating the control signal responsive to the second samples,
wherein said generating second samples comprises inputting the digitalized first samples through a digital filter that passes a predetermined signal component of the digitalized first samples as the second samples, and
wherein said generating the control signal comprises determining a power of the second samples, comparing the power to a threshold level, and generating the control signal responsive to the comparison.

* * * * *